(12) United States Patent
Yamazaki (10) Patent No.: US 7,456,469 B2
(45) Date of Patent: Nov. 25, 2008

(54) SEMICONDUCTOR DEVICE HAVING CELL TRANSISTOR WITH RECESS CHANNEL STRUCTURE

(75) Inventor: Yasushi Yamazaki, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 91 days.

(21) Appl. No.: 11/439,230

(22) Filed: May 24, 2006

(65) Prior Publication Data

US 2006/0270154 A1 Nov. 30, 2006

(30) Foreign Application Priority Data

May 24, 2005 (JP) ............................. 2005-151641

(51) Int. Cl.
*H01L 29/76* (2006.01)
(52) U.S. Cl. .................. 257/330; 257/296; 257/332; 257/E27.091; 257/E29.152; 257/E29.187; 257/E21.428
(58) Field of Classification Search .................. 257/296, 257/330, 332, E21.428, E27.091, E29.152, 257/E29.187
See application file for complete search history.

(56) References Cited

U.S. PATENT DOCUMENTS 6,844,578 B2 * 1/2005 Harada et al. ............... 257/278

FOREIGN PATENT DOCUMENTS

| JP | 11-307729 A | 11/1999 |
| JP | 2002-359294 A | 12/2002 |

* cited by examiner

*Primary Examiner*—Andy Huynh
(74) *Attorney, Agent, or Firm*—McDermott Will & Emery LLP (57) ABSTRACT

The present invention provides a semiconductor device comprising: a dual-gate peripheral transistor having a transistor structure of surface channel nMOSFET and a transistor structure of surface channel pMOSFET; and a cell transistor having an nMOSFET structure with a recess channel structure, a gate electrode of the cell transistor having an N-type polysilicon layer which contains of N-type impurities at an approximately constant concentration.

15 Claims, 11 Drawing Sheets

SEMICONDUCTOR DEVICE HAVING CELL TRANSISTOR WITH RECESS CHANNEL STRUCTURE

BACKGROUND OF THE INVENTION

1. Field of the Invention

The present invention relates to a semiconductor device having a cell transistor with recess channel structure and a method of manufacturing the same. Particularly, the present invention relates to semiconductor device having: a cell transistor with recess channel structure; a peripheral transistor having an nMOSFET structure with a gate electrode containing n-type polysilicon; and a peripheral transistor having a pMOSFET structure with a gate electrode containing p-type polysilicon.

2. Related Art

Figure 1:
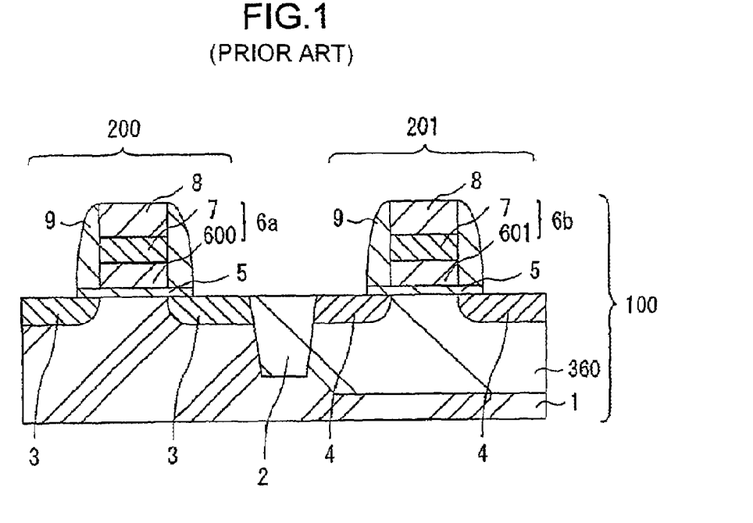
FIG. 1 is a schematic cross-sectional view illustrating substantial parts of a conventional semiconductor device.

FIG. 1 is a schematic cross-sectional view illustrating substantial parts of a conventional semiconductor device.

FIG. 1 shows a semiconductor device 100 having a transistor 200 which has an nMOSFET structure where a gate electrode 6a including an N-type polysilicon layer 600 is formed on a P-type semiconductor silicon substrate 1 and a transistor 201 which has a pMOSFET structure where a gate electrode 6b including a P-type polysilicon layer 601 is formed on an N-type well region 360.

The above-mentioned transistor 200 has the gate electrode 6a formed on the semiconductor silicon substrate 1 via a gate insulating film 5 and a pair of source/drain regions 3 corresponding to the gate electrode 6a.

The gate electrode 6a has the N-type polysilicon layer 600 and a metal silicide 7. Provided on the upper portion and at the both sides of the gate electrode 6a are insulating films 8 and 9, respectively, made of silicon nitride.

In addition, the transistor 201 has, like the transistor 200, the gate electrode 6b formed on the N-type well region 360 in the semiconductor silicon substrate 1 via a gate insulating film 5 and a pair of source/drain regions 4 corresponding to the gate electrode 6b.

The gate electrode 6b has the P-type polysilicon layer 601 and a metal silicide 7. Provided on the upper portion and at the both sides of the gate electrode 6b are insulating films 8 and 9, respectively, made of silicon nitride.

Further, the transistor 200 and the transistor 201 are separated by a device separation portion 2.

Combination of these transistors is generally called "Complementary MOS" (hereinafter referred to as "CMOS").

The source/drain region 3 corresponding to the transistor 200 includes N-type impurities and the source/drain region 4 corresponding to the transistor 201 includes P-type impurities.

The transistor of which the conductivity type of the impurities contained in the gate electrode matches the conductivity type of impurities contained in the source/drain region as described above is called "surface channel transistor".

In the semiconductor device 100 having the CMOS structure as illustrated in FIG. 1, the transistors 200 and 201 are both configured of surface channel transistors (see Japanese patent application publication No. 11-307729).

Figure 2:
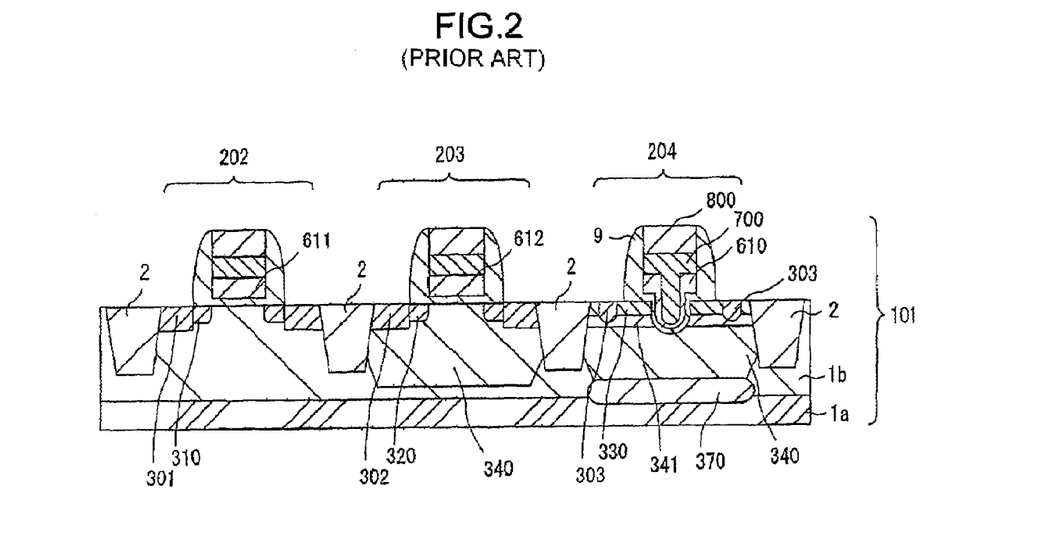
FIG. 2 is a schematic cross-sectional view illustrating substantial parts of a conventional semiconductor device.

Meanwhile, FIG. 2 is a schematic cross-sectional view illustrating substantial parts of another conventional semiconductor device.

FIG. 2 illustrates a semiconductor device 101 having a transistor 202 having a pMOSFET structure where a gate electrode 611 including a P-type polysilicon layer is formed on an N-type epitaxial layer 1b, a transistor 203 having an nMOSFET structure where a gate electrode 612 including a P-type polysilicon layer is formed on a P-type well region 340, and a transistor 204 having a pMOSFET structure where a gate electrode 204 including a P-type polysilicon layer 610 with a recess channel structure is formed on the P-type well region 340.

Source/drain regions 301 corresponding to the transistor 202 are formed of P-type high-concentration impurity layers on the surface of the N-type epitaxial layer 1b provided on the semiconductor silicon substrate 1a.

Further, deposited along with the source/drain regions 301 are P-type low-concentration impurity layers 310.

Besides, source/drain regions 302 corresponding to the transistor 203 are formed of N-type high-concentration impurity layers on the surface of the P-type well region 340.

Further, deposited along with the source/drain regions 302 are N-type low-concentration impurity layers 320.

The transistor 204 has a recess channel structure, however, the source/drain regions 303 corresponding to the transistor 204 are formed of P-type high-concentration impurity layers on the surface of the N-type body regions 341.

Further, deposited along with the source/drain regions 303 are P-type low-concentration impurity layers 330.

The N-type body regions 341 are formed inside the P-type well region 340, and a P-type buried layer 370 is formed at the lower portion of the P-type well region 340.

Further, the recess channel structure is made of insulating films 9, a P-type polysilicon layer 610 and a conducting layer 700, and provided on the upper face of and on the side faces of the conducting layer 700 are insulating films 800 and 9, respectively, made of silicon nitride.

In addition, the transistors 202, 203 and 204 are separated from each other by the device separation portions 2.

As described above, the transistor 202 is a surface channel transistor as the gate electrode 611 includes the P-type polysilicon layer and the source/drain regions 301 corresponding to pMOSFET structure contains P-type impurities.

On the other hand, the transistor 203 is generally called "buried channel transistor" as the gate electrode 612 includes the P-type polysilicon layer and the P-type well region corresponding to nMOSFET structure contains P-type impurities.

The semiconductor device 101 having a surface channel transistor, a buried channel transistor and a transistor with a recess channel structure as described above is well known (see Japanese Patent Application Publication No. 2002-359294).

BRIEF SUMMARY OF THE INVENTION

However, when the above-described knowledge was applied to a semiconductor device such as DRAM (Dynamic Random Access Memory), there occurred a problem.

The problem was such that simple combination of: a dual gate peripheral transistor having a transistor structure of a surface channel type nMOSFET structure and a transistor structure of a surface channel type pMOSFET structure; and a cell transistor having a nMOSFET structure with a recess channel structure was not enough to achieve proper operation of an obtained semiconductor device as the operating voltage of the semiconductor device fluctuated largely.

It is an object of the present invention to provide a semiconductor device having a dual gate peripheral transistor having a structure of surface channel type nMOSFET and a structure of surface channel type pMOSFET; and a cell transistor having an nMOSFET structure with a recess channel structure, the semiconductor device having little fluctuations in operating voltage and operating properly.

As a result of keen examination to overcome the aforementioned problem, the inventor of the present invention have found that the above mentioned problem was overcome by a semiconductor device in which the concentration of N-type impurities contained in the N-type polysilicon layer of the gate electrode of the cell transistor is approximately constant, and completed the present invention successfully.

Specifically, the present invention provides:

[1] a semiconductor device comprising:
    a semiconductor silicon substrate;
    device separation portions provided at predetermined positions on said semiconductor silicon substrate;
    a cell transistor having a recess channel structure being provided at a first region at said semiconductor silicon substrate defined by said device separation portions;
    a peripheral transistor having an nMOSFET structure being provided at a second region at said semiconductor silicon substrate defined by said device separation portions; and
    a peripheral transistor having an pMOSFET structure being provided at a third region at said semiconductor silicon substrate defined by said device separation portions,
    (A) said cell transistor having the recess channel structure comprising:
        (1) a recess provided at a predetermined position on said semiconductor silicon substrate;
        (2) a gate insulating film provided in contact with an inside of the recess;
        (3) a gate electrode having an N-type polysilicon layer provided in contact with the gate insulating film and a conducting layer provided in contact with the N-type polysilicon layer; and
        (4) a pair of source/drain regions including N-type diffusion layers provided at both sides of the gate electrode on a surface region of said semiconductor silicon substrate,
    (B) said peripheral transistor having the nMOSFET structure provided at the second region, having:
        (5) a gate insulating film provided at a predetermined position on said semiconductor silicon substrate;
        (6) a gate electrode having an N-type polysilicon layer provided in contact with the gate insulating film and a conducting layer provided in contact with the N-type polysilicon layer; and
        (7) a pair of source/drain regions including N-type diffusion layers provided at both sides of the gate electrode on a surface region of said semiconductor silicon substrate,
    (C) said peripheral transistor having the pMOSFET structure provided at the third region, having:
        (8) a gate insulating film provided at a predetermined position on said semiconductor silicon substrate;
        (9) a gate electrode having a P-type polysilicon layer provided in contact with the gate insulating film and a conducting layer provided in contact with the P-type polysilicon layer; and
        (10) a pair of source/drain regions including P-type diffusion layers provided at both sides of the gate electrode on a surface region of said semiconductor silicon substrate,
    the N-type polysilicon layer in said cell transistor containing an N-type impurity at an approximately constant concentration.

Further, the invention provides:

[2] the semiconductor device as described in above item [1], where the gate electrode included in the cell transistor having the recess channel structure comprises: the N-type polysilicon layer provided in contact with the gate insulating film; and the conducting layer provided in contact with the N-type polysilicon layer inside the recess and over the recess.

Furthermore, the invention provides:

[3] the semiconductor device as described in above item [1], where the gate electrode included in the cell transistor having the recess channel structure comprises: the N-type polysilicon layer provided in contact with the gate insulating film; a second polysilicon layer provided inside the N-type polysilicon layer and having an impurity concentration of less than $1.0 \times 10^{20}/cm^3$; and the conducting layer provided in contact with the N-type polysilicon layer.

Still furthermore, the invention provides: [4] the semiconductor device as described in above item [1], where the gate electrode included in the cell transistor having the recess channel structure comprises: the N-type polysilicon layer provided in contact with the gate insulating film and all over the inside of the recess; and the conducting layer provided in contact with the N-type polysilicon layer.

Still furthermore, the invention provides: [5] the semiconductor device as described in any one of above items [1] to [4], where a concentration of the N-type impurity contained in the N-type polysilicon layer in the cell transistor having the recess channel structure ranges from $1.0 \times 10^{20}$ to $1.0 \times 10^{21}/cm^3$.

In addition, the present invention provides: [6] a method of manufacturing a semiconductor device comprising the steps of:

(1) forming device separation portions at predetermined positions of a semiconductor silicon substrate and forming a first region, a second region and a third region defined by the device separation portions;

(2) forming a recess at the first region of the semiconductor silicon substrate defined by the device separation portions;

(3) forming an N-type well at the third region of the semiconductor silicon substrate defined by the device separation portions;

(4) forming a gate insulating film on an upper surface of the semiconductor silicon substrate, an inner surface of the recess and upper surfaces of the device separation portions;

(5) forming on the gate insulating film a polysilicon layer having an impurity concentration of less than $1.0 \times 10^{20}/cm^3$;

(6) forming an N-type polysilicon layer by implanting N-type impurity ions into the polysilicon layer of which the impurity concentration is less than $1.0 \times 10^{20}/cm^3$ at the first region and the second region by at least one of a vapor diffusion method and a solid-phase diffusion method;

(7) forming a P-type polysilicon layer by implanting P-type impurity ions into the polysilicon layer of which the impurity concentration is less than $1.0 \times 10^{20}/cm^3$ at the third region;

(8) after the steps (6) and (7), forming at least one of metal silicide film and a metal film on the N-type polysilicon layer and the P-type polysilicon layer;

(9) performing etching to form a gate electrode including the N-type polysilicon layer at each of the first region and second region and a gate electrode including the P-type polysilicon layer at the third region;

(10) implanting N-type impurity ions into a surface of the semiconductor silicon substrate at both sides of the gate electrode formed at each of the first region and second region to form a cell transistor having a recess channel structure at the first region and an nMOSFET structure at the second region; and (11) implanting P-type impurity ions into a surface of the semiconductor silicon substrate at both sides of the gate electrode formed at the third region to form a pMOSFET structure at the third region.

Further, the invention provides: [7] the method as described in above item [6], where in said step (6) the vapor diffusion method is performed with use of with PH3 gas and the solid-phase diffusion method is performed with use of a phosphorus containing glass.

The present invention is allowed to provide a semiconductor device that has little fluctuations in operating voltage and operates properly.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE INVENTION

With reference to the drawings, preferred embodiment of the present invention will be described below.

Figure 3:
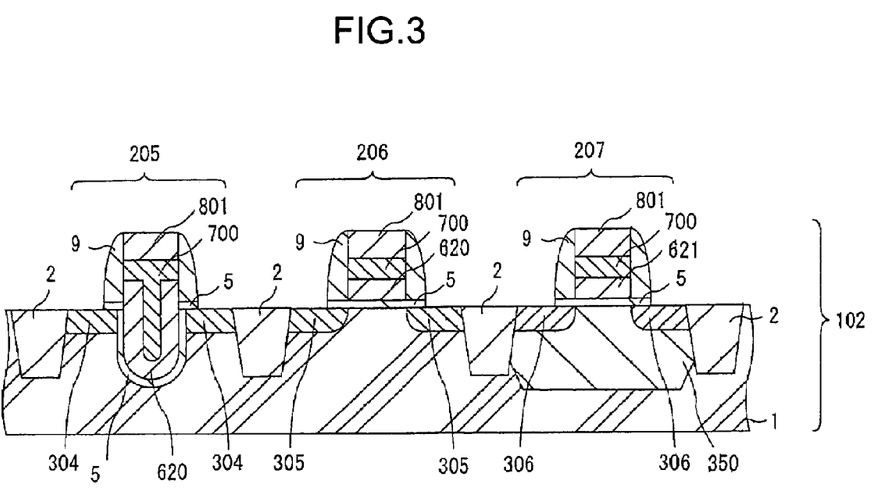
FIG. 3 is a schematic cross-sectional view illustrating substantial parts of a semiconductor device according to a first embodiment of the present invention.

FIG. 3 is a schematic cross sectional view illustrating substantial parts of a semiconductor device according to a first embodiment of the present invention.

The aforementioned semiconductor device 102 has a semiconductor silicon substrate 1.

The above-mentioned semiconductor silicon substrate 1 is not limited particularly and may be any semiconductor silicon substrate generally used for semiconductor devices. The semiconductor silicon substrate 1 used in the present invention can be a commercially available substrate such as a silicon wafer containing P-type impurities such as boron.

Besides, the semiconductor silicon substrate 1 used in the present invention has device separation portions 2 at predetermined positions.

There is no limitation on a forming method of the device separation portions 2. The device separation portions 2 may be formed by, for example, performing high-density plasma CDV or the like on the semiconductor silicon substrate 1 thereby achieving the device separation portions 2 made of silicon oxide or the like.

The semiconductor device 102 of the present invention has a cell transistor 205 having a recess channel structure provided at a first region of the semiconductor silicon substrate 1 defined by the device separation portions 2.

As illustrated in FIG. 3, the cell transistor 205 having the recess channel structure is a transistor having a recess provided at a given position of the semiconductor silicon substrate 1.

The recess can be provided by performing methods of lithography, dry etching and the like on the semiconductor silicon substrate 1.

The cell transistor 205 having the recess channel structure has a gate insulating film 5 provided in contact with the inside of the recess.

The gate insulating film 5 is generally of one or more of silicon oxide, silicon nitride, silicon oxynitride and the like. Such a gate insulating film of silicon oxide can be obtained by making silicon on the surface of the semiconductor silicon substrate 1 react with water, oxygen and the like at high temperatures.

In addition, the cell transistor 205 having the recess channel structure has a gate electrode including an N-type polysilicon layer 620 provided in contact with the gate insulating film 5 and a conducting layer 700 provided in contact with the N-type polysilicon layer 620.

As illustrated in FIG. 3, the cross section of the N-type polysilicon layer 620 is in the shape of "U". One part of the conducting layer 700 is provided in contact with the inside of the U-shaped cross section of the N-type polysilicon layer 620 while the other part of the conducting layer 700 is provided in contact with the upper side of the N-type polysilicon layer 620.

The N-type polysilicon layer 620 used in the present invention is required to contain N-type impurities at a constant concentration.

Specifically the concentration of the N-type impurities contained in the N-type polysilicon layer 620 ranges from $1.0 \times 10^{20}/cm^3$ to $1.0 \times 10^{21}/cm^3$.

When the concentration of the N-type impurities is less than $1.0 \times 10^{20}/cm^3$, the operating voltage of the obtained semiconductor device is not fixed and the semiconductor device does not operate properly.

When the concentration of the N-type impurities is more than $1.0 \times 10^{21}/cm^3$, there occurs a phenomenon of electric short or the like in the impurity region which prevents proper operation of the semiconductor device.

Such N-type impurities may include phosphorus, arsenic and the like. For ease of handling, the N-type impurities are preferably phosphorus.

The N-type polysilicon layer 620 of which the concentration of the N-type impurities is constant can be obtained by the following.

That is, formed in contact with the gate insulating film 5 is a polysilicon layer of which the impurity concentration is less than $1.0 \times 10^{20}/cm^3$, and N-type impurities such as phosphorus ions are then implanted to the polysilicon layer by the vapor diffusion method, solid-phase diffusion method or the like.

The vapor diffusion method is, for example, a method of making $PH_3$ gas react at temperatures ranging from 650° C. to 750° C. with the polysilicon layer which does not contain the impurities.

In addition, the solid-phase diffusion method is, for example, a method of making a phosphorus containing glass react with a polysilicon layer of which the impurity concentration is less than $1.0 \times 10^{20}/cm^3$.

The solid-phase diffusion method which uses the phosphorus containing glass can be performed by making $SiH_4$ and $POCl_3$ react at temperatures ranging from 800° C. to 900° C. to act on the polysilicon layer which does not contain the impurities.

The conducting layer 700 is of one or more of metals such as metal silicide including $TiSi_2$, $CoSi_2$, $TaSi_2$, $PtSi_2$ and $NiSi_2$ and tungsten.

Further, provided at the both side of the N-type polysilicon layer 620 and on the upper surface of the conducting layer 700 are insulating films 9 and 801, respectively, of silicon nitride or the like.

Furthermore, the cell transistor 205 having the recess channel structure has a pair of source/drain regions 304 including N-type diffusion layers provided at both sides of the gate electrode on the surface of the semiconductor silicon substrate 1.

The source/drain regions 304 each can be obtained as an N-type high-concentration impurity layer by ion implanting the surface of the semiconductor silicon substrate 1 with N-type impurities such as phosphorus ions with the aforementioned gate electrode used as a protection mask.

Here, in addition to the N-type high-concentration impurity layer of phosphorus, an N-type low-concentration impurity layer of phosphorus may be appropriately added to the source/drain regions 304, as is the case of FIG. 2.

The semiconductor device 102 of the present invention has a peripheral transistor 206 having an nMOSFET structure provided at a second region of the semiconductor silicon substrate 1 defined by the device separation portions 2.

As illustrated in FIG. 3, the peripheral transistor 206 having the nMOSFET structure provided at the second region has a gate insulating film 5 provided at a given position of the semiconductor silicon substrate 1.

The gate insulating film 5 can be obtained by making silicon on the surface of the semiconductor silicon substrate 1 react with water, oxygen and the like at high temperatures, as is the case with the cell transistor 205 having the recess channel structure provided on the first region.

Further, the peripheral transistor 206 having the nMOSFET structure provided on the second region has a gate electrode including an N-type polysilicon layer 620 provided in contact with the gate insulating film 5 and a conducting layer 700 provided in contact with the N-type polysilicon layer 620.

This N-type polysilicon layer 620 is provided on the semiconductor silicon substrate 1 via the gate insulating film 5, which differs from the aforementioned case of the cell transistor 205 having the recess channel structure.

The N-type polysilicon layer 620 used in the present invention contains N-type impurities of which the concentration is approximately constant as is the aforementioned case of the cell transistor 205.

The conducting layer 700 is provided in contact with the N-type polysilicon layer 620. The conducting layer 700 is also the same as is used in the cell transistor 205 having the recess channel structure.

Further, provided at the both sides of the N-type polysilicon layer 620 are insulating films 9 of silicon nitride or the like, and provided at the both sides of and on the surface of the conducting layer are insulating films 9 and 801, respectively, of silicon nitride.

The peripheral transistor 206 having the nMOSFET structure provided at the second region has a pair of source/drain regions 305 including N-type diffusion layers provided at the both sides of the gate electrode on the surface of the semiconductor silicon substrate 1.

Each of the source/drain regions 305 can be obtained as an N-type high-concentration impurity layer by ion implanting the surface of the semiconductor silicon substrate 1 with N-type impurities such as phosphorus ions with the aforementioned gate electrode used as a protection mask.

Here, as is the case of FIG. 2, in addition to the N-type high-concentration impurity layer, an N-type low-concentration impurity layer of phosphorus may be appropriately added to the source/drain regions 305.

The semiconductor device 102 of the present invention has a peripheral transistor 207 having a pMOSFET structure provided at a third region of the semiconductor silicon substrate 1 defined by the device separation portions 2.

As illustrated in FIG. 3, the peripheral transistor 207 having the pMOSFET structure provided at the third region has a gate insulating film 5 provided at a given position of the semiconductor silicon substrate 1.

The gate insulating film 5 can be provided by the same method as that of the cell transistor 205.

Further, the peripheral transistor 207 having the pMOS-FET structure provided on the third region has a gate electrode including a P-type polysilicon layer 621 provided in contact with the gate insulating film 5 and a conducting layer 700 provided in contact with the P-type polysilicon layer 621.

The gate electrode of the peripheral transistor 206 having nMOSFET provided at the second region has the N-type polysilicon layer 620, while the gate electrode of the peripheral transistor 207 having pMOSFET provided at the third region has the P-type polysilicon layer 621, which is different from the case of the peripheral transistor 206.

In other words, the peripheral transistor 206 and the peripheral transistor 207 are both surface channel transistors.

The concentration of the P-type impurities contained in the P-type polysilicon layer 621 preferably ranges from $1.0 \times 10^{20}/cm^3$ to $1.0 \times 10^{21}/cm^3$.

The P-type impurities include, for example, boron.

The conducting layer 700 is the same as is used in the cell transistor 205 having the recess channel structure.

Further, provided at the both sides of the P-type polysilicon layer 621 are insulating films 9 of silicon nitride or the like, and provided at the both sides of and on the surface of the conducting layer are insulating films 9 and 801, respectively, of silicon nitride.

The peripheral transistor 207 having the pMOSFET structure provided at the third region has a pair of source/drain regions 306 including N-type diffusion layers provided at the both sides of the gate electrode on the surface of the N-type well region 350 provided in the semiconductor silicon substrate 1.

Each of the source/drain regions 306 can be obtained as a P-type high-concentration impurity layer by ion implanting the surface of the semiconductor silicon substrate 1 with P-type impurities such as boron ions with the aforementioned gate electrode used as a mask.

Here, as is the case of FIG. 2, in addition to the P-type high-concentration impurity layer of boron or the like, a P-type low-concentration impurity layer of boron may be appropriately added to the source/drain regions 306.

Figure 4:
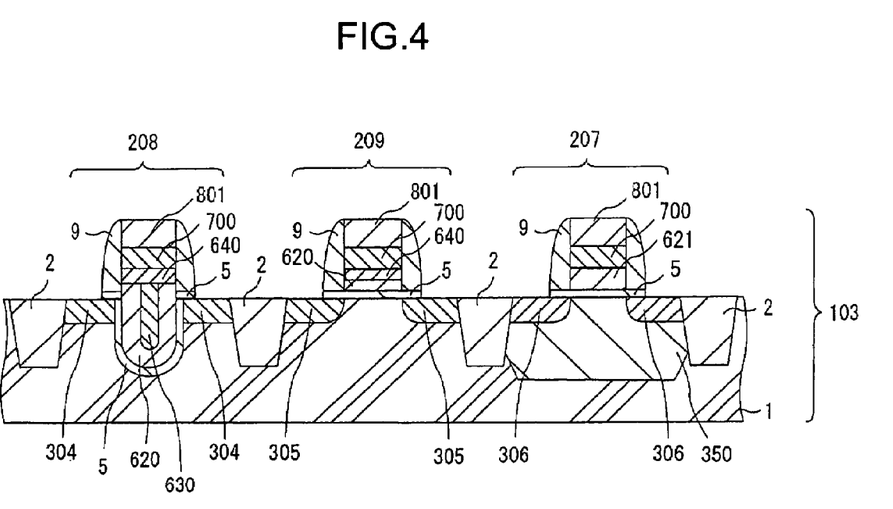
FIG. 4 is a schematic cross-sectional view illustrating substantial parts of a semiconductor device according to a second embodiment of the present invention.

Next description is made about a semiconductor device according to a second embodiment of the present invention.

FIG. 4 is a schematic cross sectional view illustrating substantial parts of the semiconductor device according to a second embodiment of the present invention.

The configuration of the semiconductor device 103 of the present invention is similar to that of the semiconductor device 102 of the present invention in the case of FIG. 3 except for a configuration of a gate electrode of a cell transistor 208 having a recess channel structure provided at the first region in FIG. 4 and a configuration of a gate electrode of a peripheral transistor 209 having an NMOSFET structure provided in the second region in FIG. 4.

The following description is made mainly about differences from the semiconductor device 102 according to the first embodiment.

First, the gate electrode of the cell transistor 205 having the recess channel structure of the semiconductor device 102 according to the first embodiment in FIG. 3 has the N-type polysilicon layer 620 and the conducting layer 700, while the gate electrode of the cell transistor 208 having the recess channel structure of the semiconductor device 103 according to the second embodiment has an N-type polysilicon layer 620 as described above, a second polysilicon layer 630 of which the impurity concentration is less than $1.0 \times 10^{20}/cm^3$, a third N-type polysilicon layer 640 and a conducting layer 700.

The configurations of the N-type polysilicon layer 620 and the conducting layer 700 of the semiconductor device 103 are the same as those of the above-described semiconductor device 102.

As illustrated in FIG. 4, the second polysilicon layer 630 of which the impurity concentration is less than $1.0 \times 10^{20}/cm^3$ is deposited between the N-type polysilicon layer 620 and the third N-type polysilicon layer 640.

The impurities contained in the second polysilicon layer 630 include N-type impurities such as phosphorus.

In addition, the third N-type polysilicon layer 640 contains N-type impurities therein and the N-type impurities include, for example, phosphorus.

Next, the gate electrode of the peripheral transistor 206 having the nMOSFET of the semiconductor device 102 shown in FIG. 3 has the N-type polysilicon layer 620 and the conducting layer 700, while the gate electrode of the cell transistor 209 having the nMOSFET structure of the semiconductor device 103 according to the second embodiment shown in FIG. 4 has the N-type polysilicon layer 620, the third N-type polysilicon layer 640 and the conducting layer 700.

The concentration of N-type impurities contained in the N-type polysilicon layer 620 and the third polysilicon layer 640 preferably ranges from $1.0 \times 10^{20}/cm^3$ to $1.0 \times 10^{21}/cm^3$.

Although the concentration of the N-type impurities contained in the third polysilicon layer 640 does not has to agree with that of the N-type polysilicon layer 620, it is preferable that they are in agreement.

The semiconductor device of the present invention illustrated as the semiconductor devices 102, 103 and the like is advantageously usable for DRAM (Dynamic Random Access Memory) and so on.

The following description is made more in detail about the present invention on the basis of the examples.

However, these examples are not for limiting the present invention.

EXAMPLE 1

Figure 5:
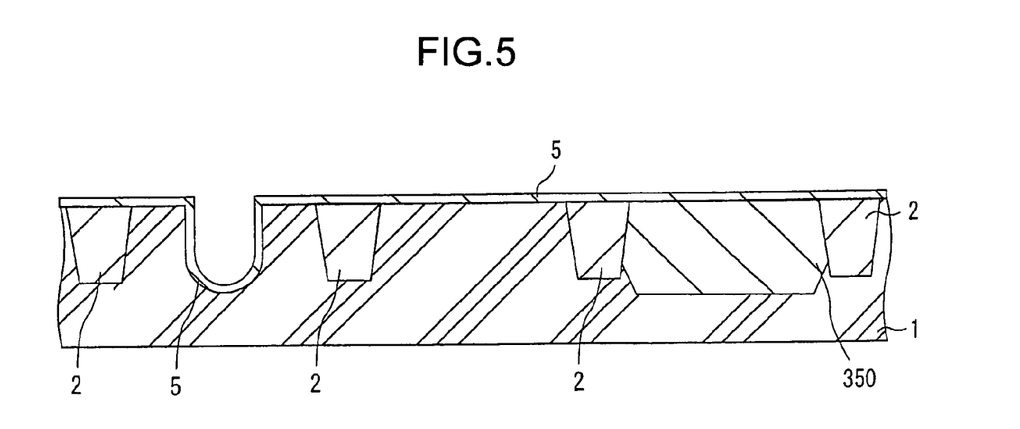
FIG. 5 is a schematic cross sectional view illustrating substantial parts of a semiconductor silicon substrate for explaining the process of a manufacturing method according to Example 1 of the present invention.

FIG. 5 is a schematic cross sectional view illustrating substantial parts of a semiconductor silicon substrate for explaining the process of a manufacturing method according to Example 1 of the present invention.

The following description is made about the example with reference to the drawings.

As illustrated in FIG. 5, the device separation portions 2 and the N-type well region 350 were formed on the semiconductor silicon substrate 1 containing P-type impurities, and then, the lithography technique, dry etching technique and the like were used to form a recess having a recess width of 90 nm and a depth of 150 nm.

Next, a gate insulating film 5 of silicon oxide was formed on the surface of the semiconductor silicon substrate 1 having a thickness of 10 nm.

The gate insulating film 5 maybe formed of silicon oxynitride film, silicon nitride film or the like. Besides, the formed gate insulating film 5 may include one or more kinds of films.

Figure 6:
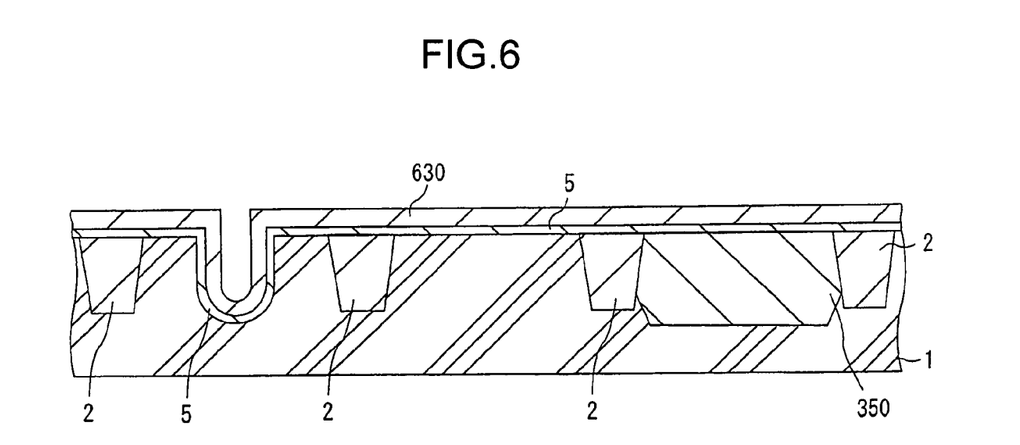
FIG. 6 is a schematic cross sectional view illustrating substantial parts of the semiconductor silicon substrate for explaining the process of the manufacturing method according to Example 1 of the present invention.

Then, the CDV method was used to form on the gate insulating film 5 a polysilicon layer 630 of which the impurity concentration is less than $1.0 \times 10^{20}/\text{cm}^3$, as shown in FIG. 6. The thickness of the polysilicon layer 630 was 40 nm.

The thickness of the polysilicon layer 630 is appropriately determined by a stress which the side walls of the gate electrodes and conducting layer apply on the gate insulating film 5, however, the thickness is preferably 40 nm or more.

Figure 7:
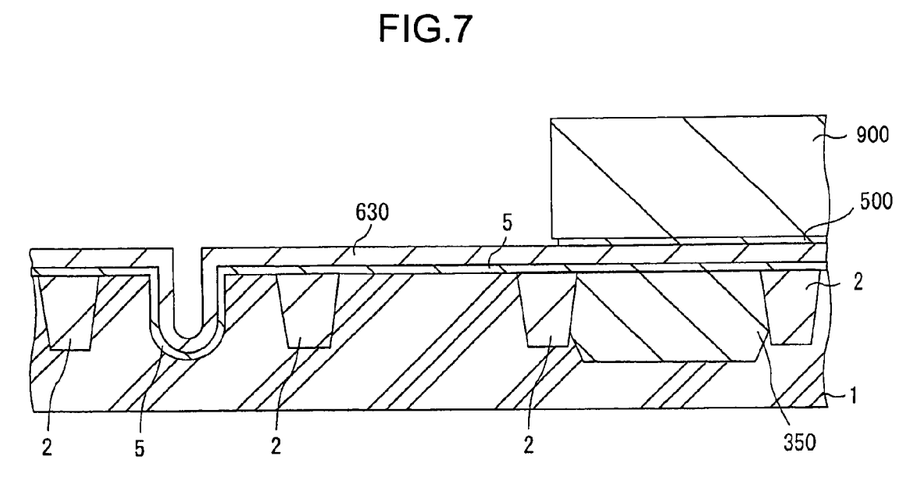
FIG. 7 is a schematic cross sectional view illustrating substantial parts of the semiconductor silicon substrate for explaining the process of the manufacturing method according to Example 1 of the present invention.

Then, the CDV method was used to form a protection silicon oxide layer 500 on the polysilicon layer 630 having a thickness of 20 nm, and after that, a photoresist layer 900 was further formed thereon. Unnecessary portions of the photoresist layer were removed by the lithography technique and dry etching technique. Then, using the photoresist layer 900 as a protection mask, unnecessary portions of the protection silicon oxide layer 500 were removed by the lithography technique and wet etching technique, thereby forming a protection oxide film 500 as shown in FIG. 7.

Figure 8:
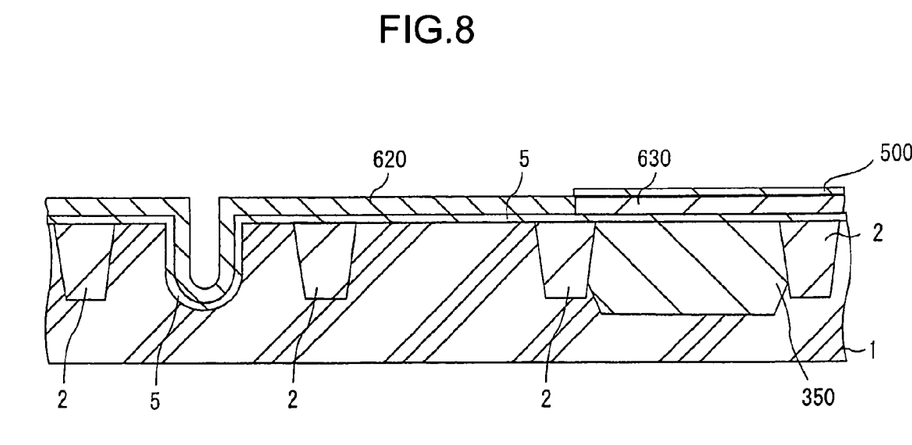
FIG. 8 is a schematic cross sectional view illustrating substantial parts of the semiconductor silicon substrate for explaining the process of the manufacturing method according to Example 1 of the present invention.

After the photoresist layer 900 were removed by dry etching, ashing or other technique, the polysilicon layer 630 was subjected to vapor diffusion method with $PH_3$ gas in a diffusion furnace set at a temperature of 700° C. with the protection oxide film 500 used as a protection mask, and phosphorus ions were implanted onto portions of the polysilicon layer 630 which were not covered by the protection mask. Thus formed was an N-type polysilicon layer 620 as illustrated in FIG. 8.

The concentration of the N-type impurities, i.e. phosphorus, contained in the N-type polysilicon layer 620 ranged from $1.0 \times 10^{20}/\text{cm}^3$ to $1.0 \times 10^{21}/\text{cm}^3$.

Figure 9:
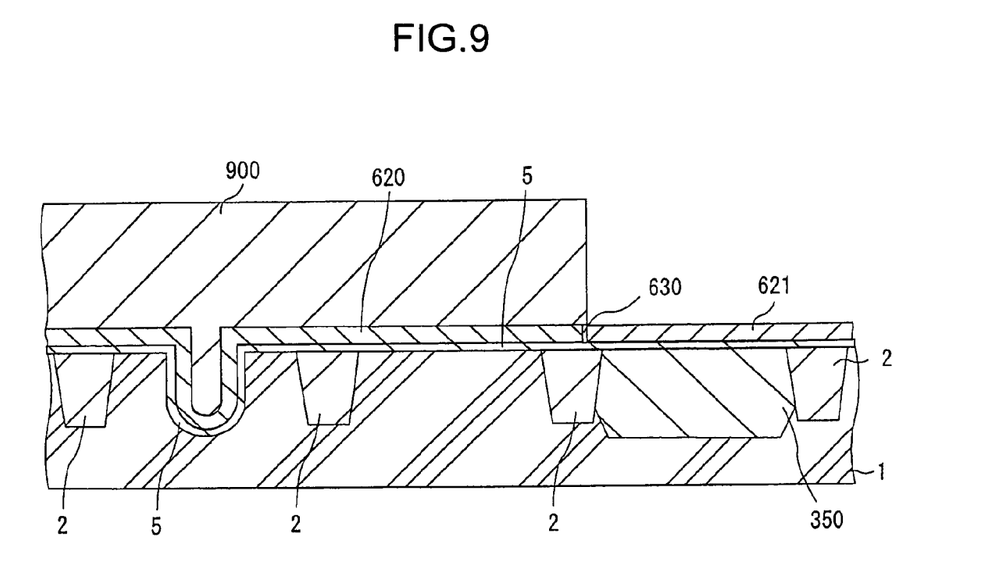
FIG. 9 is a schematic cross sectional view illustrating substantial parts of the semiconductor silicon substrate for explaining the process of the manufacturing method according to Example 1 of the present invention.

Then, as shown in FIG. 9, a photoresist layer 900 formed on the N-type polysilicon layer 620 was used as a protection mask to implant the polysilicon layer 630 with boron ions at an implantation amount ranging from $1.0 \times 10^{15}$ to $1.0 \times 10^{16}/\text{cm}^2$ thereby forming a P-type polysilicon layer 621.

Figure 10:
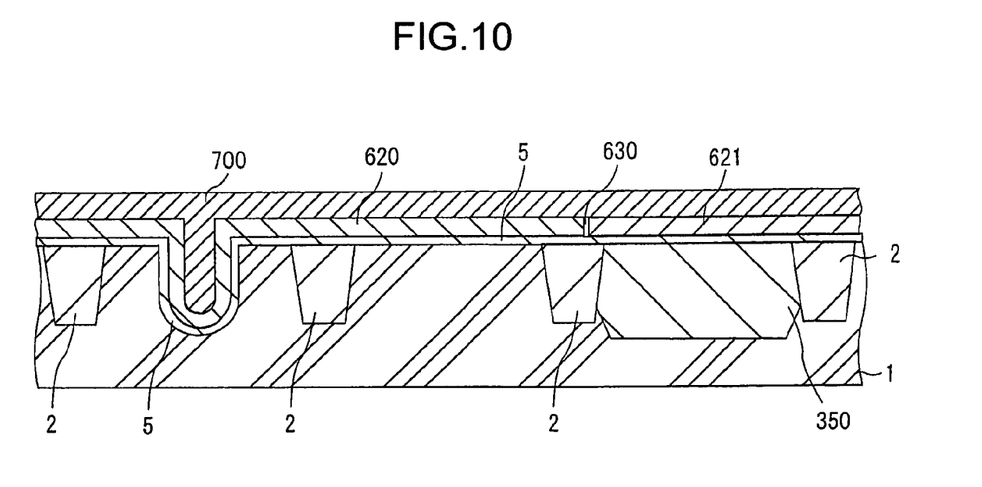
FIG. 10 is a schematic cross sectional view illustrating substantial parts of the semiconductor silicon substrate for explaining the process of the manufacturing method according to Example 1 of the present invention.

After the photoresist layer 900 were removed by dry etching, ashing or other technique, PVD method, the CVD method or the like was used to allow the conducting layer 700 to be formed as illustrated in FIG. 10.

The conducting layer 700 is of one or more of, for example, tungsten silicide, tungsten metal and the like.

Figure 11:
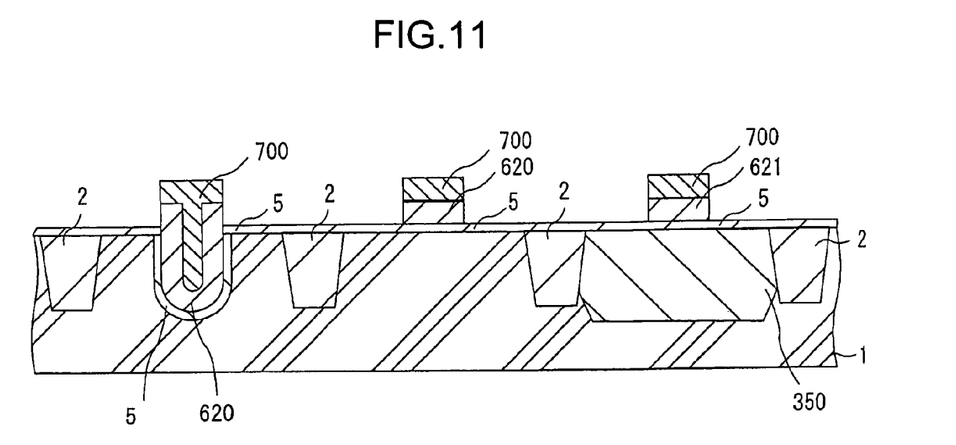
FIG. 11 is a schematic cross sectional view illustrating substantial parts of the semiconductor silicon substrate for explaining the process of the manufacturing method according to Example 1 of the present invention.

The polysilicon layers 620, 621 and 630 and the conducting layer 700 were removed by the lithography technique, the dry etching technique and the like with a photoresist layer (not shown) used as a protection mask, thereby forming a structure illustrated in FIG. 11.

Figure 12:
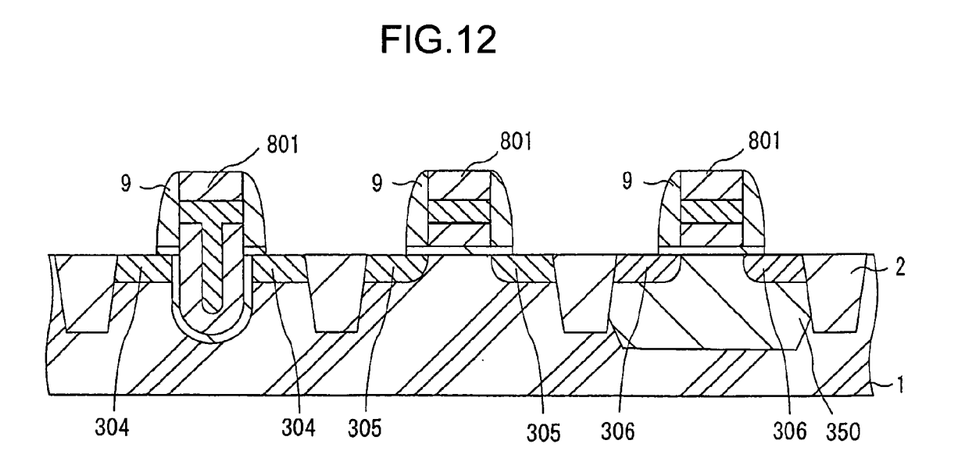
FIG. 12 is a schematic cross sectional view illustrating substantial parts of the semiconductor device of the present invention (Example 1)

Then, an insulating film of silicon nitride or the like was formed on the structure shown in FIG. 11, the anisotropic etching method was used to form gate electrode upper structures of insulating films 801 and gate electrode side walls of insulating films 9 as illustrated in FIG. 12.

With the gate electrodes shown in FIG. 12 used as protection masks, N-type impurities of phosphorus ions were implanted to the surface of the semiconductor silicon substrate 1, thereby forming source/drain regions 304 and 305 each made of high-concentration N-type impurity layers.

Likewise, P-type impurities of boron ions or the like were implanted to the surface of the N-type well 530 thereby forming source/drain regions 306 of high-concentration P-type impurity layers.

With this process, the structure of Example 1 of the present invention illustrated in FIG. 3 can be achieved.

Here, as shown in FIG. 3, the gate electrode made of the polysilicon layer 620 containing N-type impurities and the conducting layer 700 of the cell transistor 205 having a recess channel structure has a feature of small wiring resistance as tungsten silicide, tungsten metal or the like is buried.

A thus-obtained semiconductor device 102 has small fluctuations of operating voltage and operates properly and therefore, it can be advantageously used for DRAM (Dynamic Random Access Memory).

EXAMPLE 2

Example 2 adopts the process of manufacturing method shown in FIGS. 5 to 8 of Example 1. However, a recess provided on the semiconductor silicon substrate used in Example 2 has a width of 70 nm and a depth of 150 nm, which is different from those of Example 1.

Figure 15:
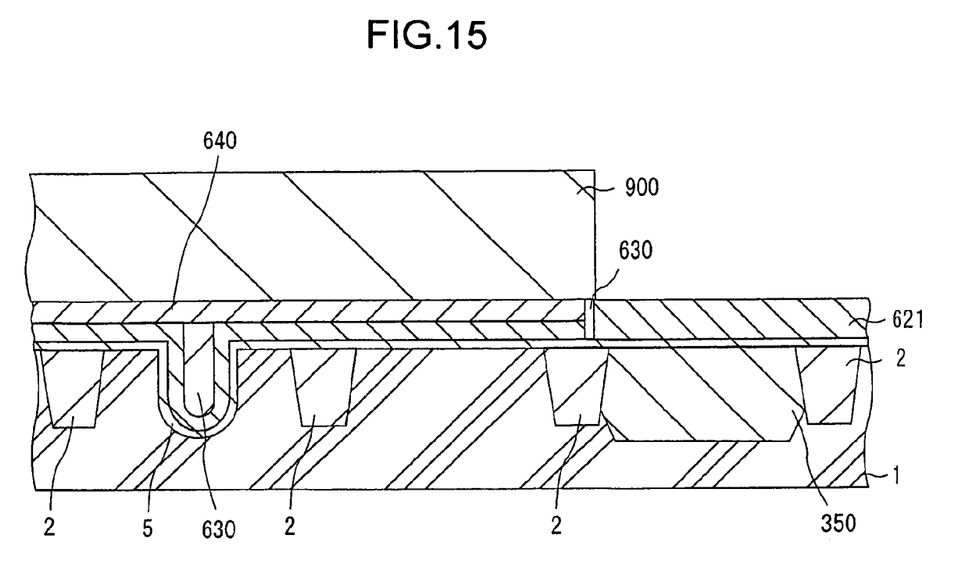
FIG. 15 is a schematic cross sectional view illustrating substantial parts of the semiconductor silicon substrate for explaining the process of the manufacturing method according to Example 2 of the present invention.

FIG. 15 is a cross sectional view of a semiconductor silicon substrate for explaining the process of a manufacturing method according to Example 2 of the present invention.

The following description is made about an embodiment of the example with reference to the drawings.

Figure 13:
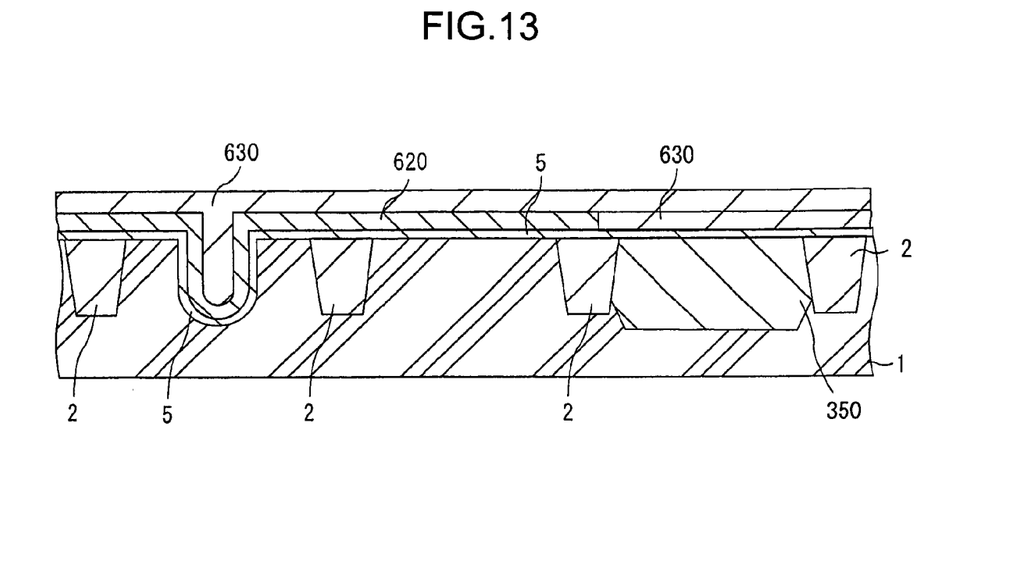
FIG. 13 is a schematic cross sectional view illustrating substantial parts of a semiconductor silicon substrate for explaining the process of a manufacturing method according to Example 2 of the present invention.

After the protection oxide film 500 illustrated in FIG. 8 was removed, formed all over the polysilicon layers 620 and 630 was a polysilicon layer 630 having an impurity concentration of less than $1.0 \times 10^{20}/\text{cm}^3$, thereby obtaining a structure shown in FIG. 13.

The thickness of the polysilicon layer 630 pf which the impurity concentration is less than $1.0 \times 10^{20}/\text{cm}^3$ ranges from 10 to 20 nm.

Here, the thickness of the polysilicon layer 630 of which the impurity concentration was less than $1.0 \times 10^{20}/\text{cm}^3$ ranged from 10 to 20 nm.

The thickness of the polysilicon layer 620 formed under the polysilicon layer 630 of which the impurity concentration was less than $1.0 \times 10^{20}/\text{cm}^3$ was 30 nm.

Figure 14:
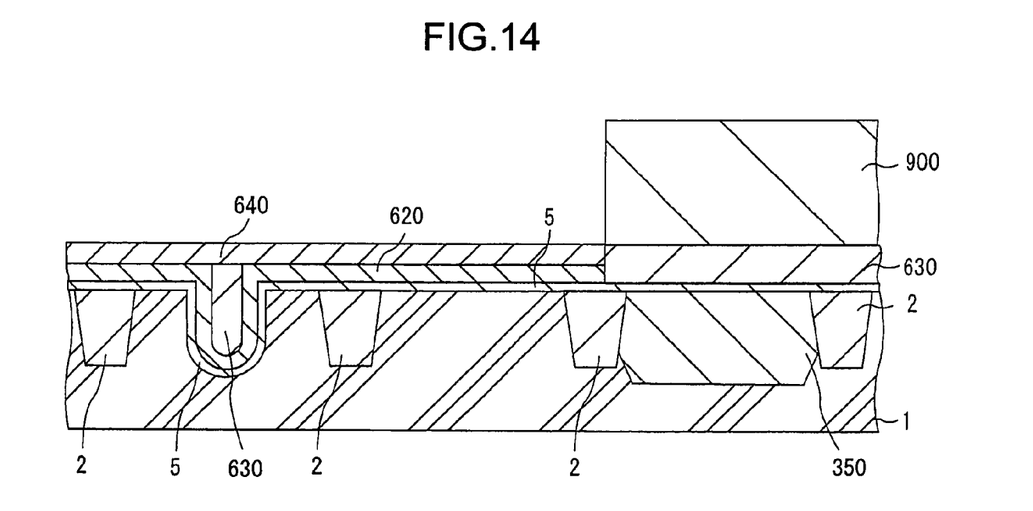
FIG. 14 is a schematic cross sectional view illustrating substantial parts of the semiconductor silicon substrate for explaining the process of the manufacturing method according to Example 2 of the present invention.

Next, as illustrated in FIG. 14, formed on a corresponding position above the N-type well 350 was a photoresist layer 900, and using the photoresist layer 900 as a protection mask, the polysilicon layer 630 with no impurity was implanted with N-type impurities such as phosphorus ions, thereby forming a third N-type polysilicon layer 640.

This was followed by removing the photoresist layer 900, and as illustrated in FIG. 15, a photoresist layer was newly formed on the third N-type polysilicon layer 640.

The photoresist layer 900 being used as a protection mask, the polysilicon layer 630, of which the impurity concentration was less than $1.0 \times 10^{20}/\text{cm}^3$ and which was formed at the corresponding position over the N-type well 350, was implanted with P-type impurities such as boron ions, thereby forming the P-type polysilicon layer 621.

Here, when the third N-type polysilicon layer 640 and the P-type polysilicon layer 621 are formed, if energy by the ion implantation method is strong, the N-type impurities such as phosphorus and the P-type impurities such as boron are made to pass through the polysilicon layer 640 and the like, and there occurs penetration of the N-type impurities such as phosphorus and the P-type impurities such as boron into the surface of the semiconductor silicon substrate 1.

Occurrence of such a penetration causes fluctuations of threshold voltage of an obtained semiconductor device, which presents a problem that the semiconductor device does not operate properly.

Accordingly, when the sum of the thickness of the polysilicon layer 640 and the thickness of the polysilicon layer 620 above the semiconductor silicon substrate 1 is 100 nm, for example, the implantation energies of phosphorus and boron are preferably 10 keV or less and 5 keV or less, respectively.

Figure 16:
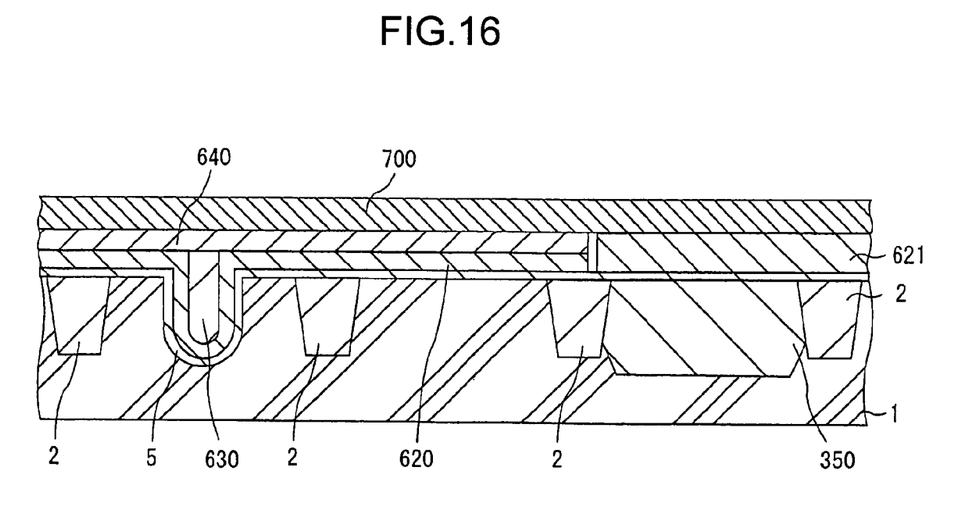
FIG. 16 is a schematic cross sectional view illustrating substantial parts of the semiconductor silicon substrate for explaining the process of the manufacturing method according to Example 2 of the present invention.

Then, the photoresist layer 900 was removed by dry etching, ashing and the like, and the conducting layer 700 was formed by the PVD method, CVD method or the like, as shown in FIG. 16.

The constitution of the conducting layer 700 used in Example 2 is the same as that in Example 1.

Figure 17:
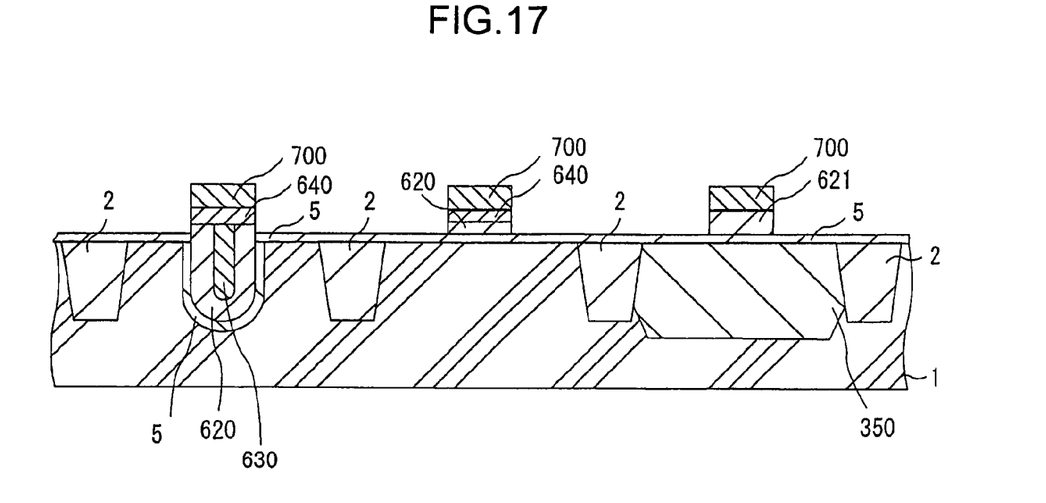
FIG. 17 is a schematic cross sectional view illustrating substantial parts of the semiconductor silicon substrate for explaining the process of the manufacturing method according to Example 2 of the present invention.

The polysilicon layers 620, 621 and 640 and the conducting layer 700 were removed by dry etching, ashing and the like with use of a photoresist layer (not shown) as a protection mask, and thereby a structure shown in FIG. 17 was formed.

The process below was performed as is the case of Example 1, thereby to achieve the structure according to the second embodiment of the present invention shown in FIG. 4.

Here, as illustrated in FIG. 4, tungsten silicide, tungsten metal or the like is buried in the gate electrode including the polysilicon layer 620 containing N-type impurities, the second polysilicon layer 630 of which the impurity concentration is less than $1.0\times10^{20}/cm^3$, the third polysilicon layer 640 containing N-type impurities and the conducting layer 700 in the cell transistor 208 having the recess channel structure. Accordingly, it has a feature of small wiring resistance.

The concentration of phosphorus as N-type impurities contained in the N-type polysilicon layer of the cell transistor 208 having the recess channel structure ranges from $1.0\times10^{20}/cm^3$ to $1.0\times10^{21}/cm^3$.

A thus-obtained semiconductor device 103 has small fluctuations of operating voltage and operates properly and therefore, it can be advantageously used for DRAM (Dynamic Random Access Memory).

EXAMPLE 3

When the gate electrode of the cell transistor 208 having the recess channel structure of the semiconductor device 103 shown in FIG. 4 was subjected to heating processing at temperatures ranging from 650° C. to 800° C., phosphorus contained in the polysilicon layer 620 containing N-type impurities, the second polysilicon layer 630 of which the impurity concentration is less than $1.0\times10^{20}/cm^3$ and the third polysilicon layer 640 containing N-type impurities of the gate electrode was diffused thereby equalizing the phosphorus concentrations across the respective regions within a range from $1.0\times10^{20}/cm^3$ to $1.0\times10^{21}/cm^3$.

When the temperature was less than 650° C., it was difficult to make phosphorus contained in the semiconductor silicon substrate 1 become active, while the temperature was above 800° C., P-type impurities such as boron contained in the P-type polysilicon layer in the gate electrode of the peripheral transistor 207 was diffused into the semiconductor silicon substrate 1, which prevented the semiconductor device from operating properly.

A thus-obtained semiconductor device 104 (not shown) has small fluctuations of operating voltage and operates properly and therefore, it can be advantageously used for DRAM (Dynamic Random Access Memory).

COMPARATIVE EXAMPLE 1

Figure 18:
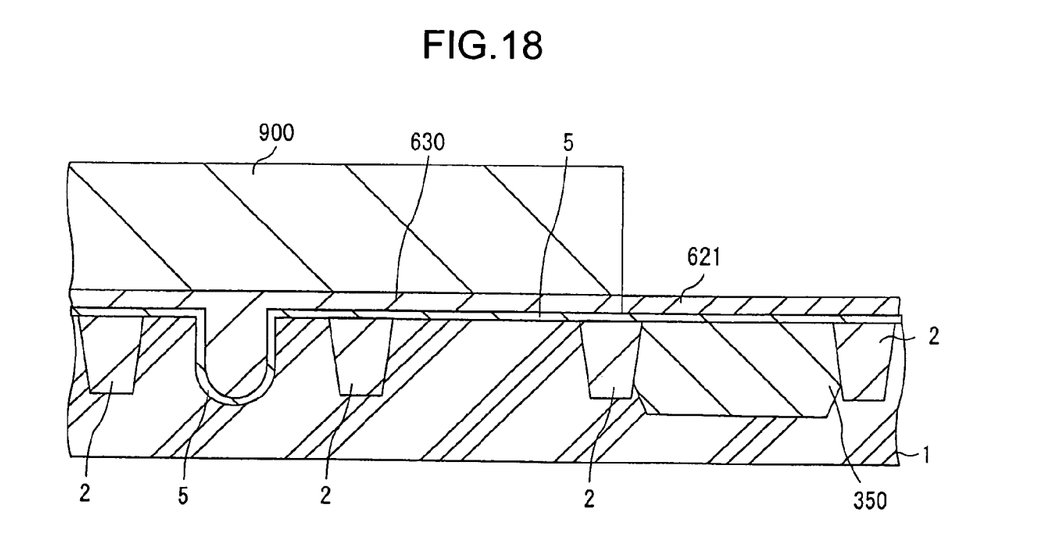
FIG. 18 is a schematic cross sectional view illustrating substantial parts of a semiconductor silicon substrate for explaining the process of a manufacturing method according to Comparative example.

After the polysilicon layer 630 of which the impurity concentration was less than $1.0\times10^{20}/cm^3$ was provided in the structure of Example 1 shown in FIG. 5, a photo resist layer 900 was formed on the semiconductor silicon substrate 1 excepting a portion corresponding to the N-type well region 350. The photoresist layer 900 being used as a protection mask, the second polysilicon layer 630 on the portion corresponding to the N-type well region 350, of which the impurity concentration is less than $1.0\times10^{20}/cm^3$ was implanted with P-type impurities such as boron ions and thereby the P-type polysilicon layer 621 was formed as shown in FIG. 18.

Figure 19:
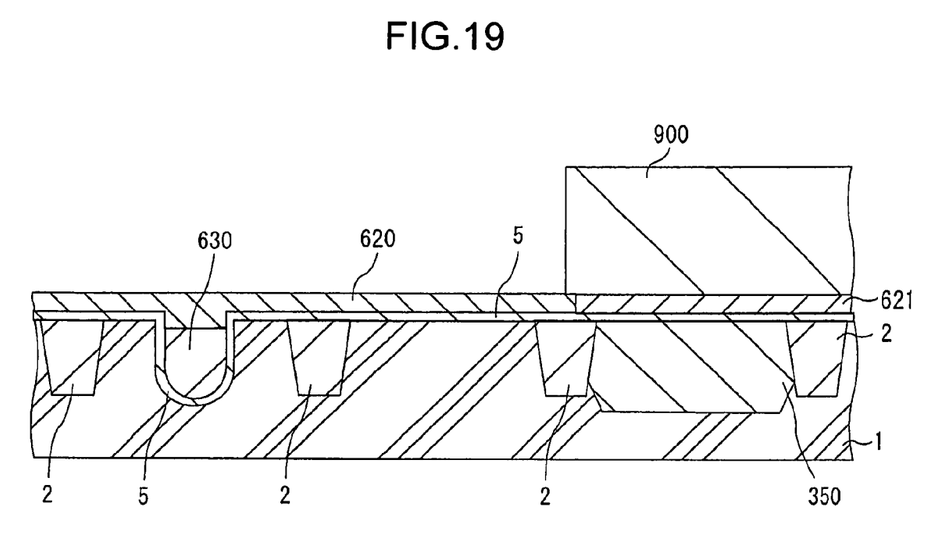
FIG. 19 is a schematic cross sectional view illustrating substantial parts of the semiconductor silicon substrate for explaining the process of the manufacturing method according to Comparative example.

Then, after the photoresist layer 900 was removed, another photoresist layer was formed on the P-type polysilicon layer 621 as shown in FIG. 19. This photoresist layer 900 being used as a protection mask, the polysilicon layer 630 was implanted with N-type impurities such as phosphorus ions and thereby the N-type polysilicon layer 620 was formed as shown in FIG. 19.

At this time, the N-type impurity concentration of phosphorus or the like contained in the lowermost polysilicon layer 630 formed in the recess was less than $1.0\times10^{20}/cm^3$.

Figure 20:
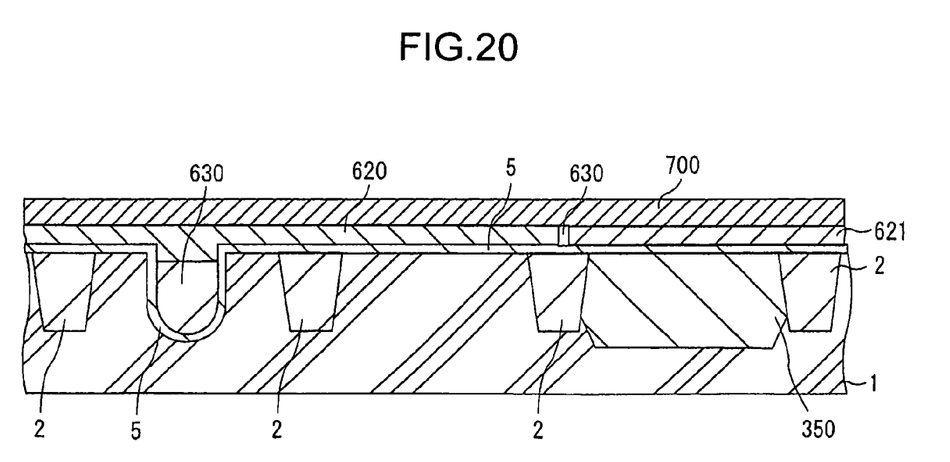
FIG. 20 is a schematic cross sectional view illustrating substantial parts of the semiconductor silicon substrate for explaining the process of the manufacturing method according to Comparative example.

Next, after the photoresist layer 900 was removed, PVD method, the CVD method or the like was used to allow a conducting layer to grow as shown in FIG. 20.

Here, the constitution of the conducting layer used in Comparative example 1 is the same as that in Example 1.

Figure 21:
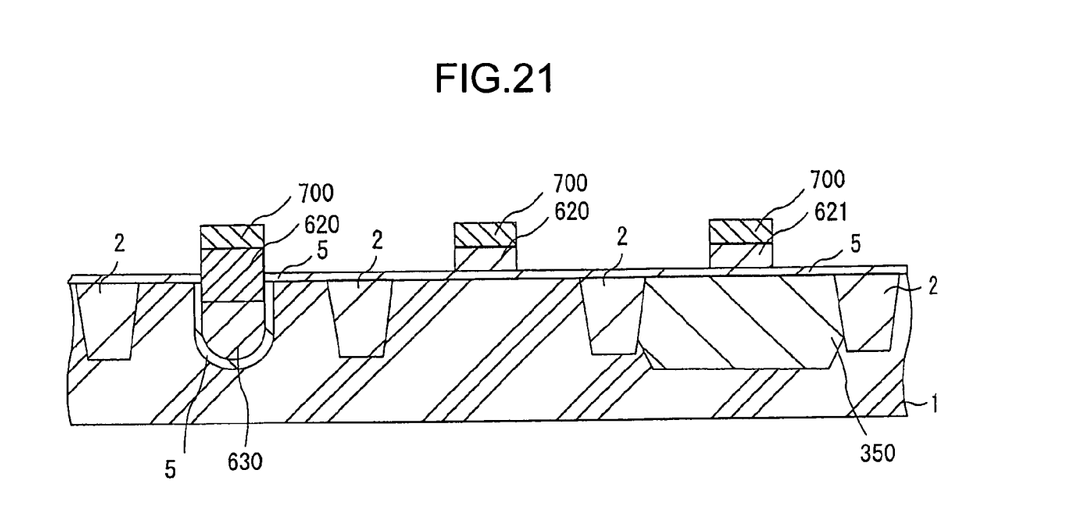
FIG. 21 is a schematic cross sectional view illustrating substantial parts of the semiconductor silicon substrate for explaining the process of the manufacturing method according to Comparative example.

The polysilicon layers 620, 621 and 630 and the conducting layer 700 were removed by lithography, dry etching and the like with use of a photoresist layer (not shown) as a protection mask, and thereby a structure shown in FIG. 21 was formed.

Figure 22:
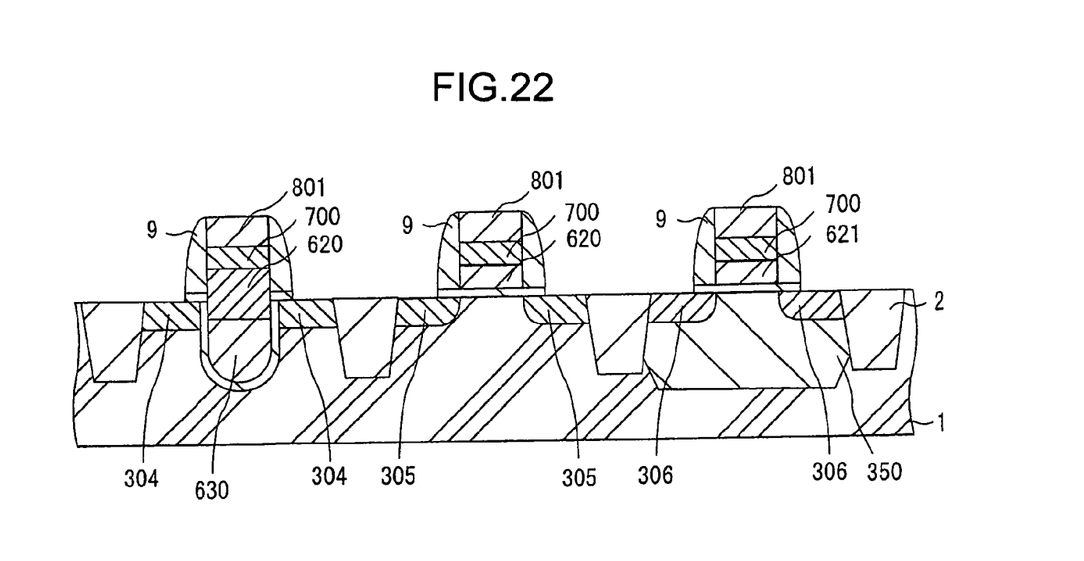
FIG. 22 is a schematic cross sectional view illustrating substantial parts of the semiconductor device of Comparative example (Comparative example)

The following process was performed as is the case of Example 1, thereby to achieve a semiconductor device shown in FIG. 22.

In the semiconductor device shown in FIG. 22, as there was a depletion layer in the gate electrode of the cell transistor having recess channel structure, the semiconductor device showed large fluctuations in operating voltage and did not operate properly.

The present invention is not limited to the above described embodiments, and various variations and modifications may be possible without departing from the scope of the present invention.

This application is based on the Japanese Patent application No. 2005-151641 filed on May 24, 2005, entire content of which is expressly incorporated by reference herein.

What is claimed is:

1. A semiconductor device comprising:
   a semiconductor silicon substrate;
   device separation portions provided at predetermined positions on said semiconductor silicon substrate;
   a cell transistor having a recess channel structure being provided at a first region at said semiconductor silicon substrate defined by said device separation portions;
   a peripheral transistor having an nMOSFET structure being provided at a second region at said semiconductor silicon substrate defined by said device separation portions; and
   a peripheral transistor having an pMOSFET structure being provided at a third region at said semiconductor silicon substrate defined by said device separation portions,
   (A) said cell transistor having the recess channel structure comprising:
   (1) a recess provided at a predetermined position on said semiconductor silicon substrate;
   (2) a gate insulating film provided in contact with an inside of the recess;
   (3) a gate electrode having an N-type polysilicon layer provided in contact with the gate insulating film and a conducting layer provided in contact with the N-type polysilicon layer; and
   (4) a pair of source/drain regions including N-type diffusion layers provided at both sides of the gate electrode on a surface region of said semiconductor silicon substrate, (B) said peripheral transistor having the nMOSFET structure provided at the second region, having:
(5) a gate insulating film provided at a predetermined position on said semiconductor silicon substrate;
(6) a gate electrode having an N-type polysilicon layer provided in contact with the gate insulating film and a conducting layer provided in contact with the N-type polysilicon layer; and
(7) a pair of source/drain regions including N-type diffusion layers provided at both sides of the gate electrode on a surface region of said semiconductor silicon substrate,
(C) said peripheral transistor having the pMOSFET structure provided at the third region, having:
(8) a gate insulating film provided at a predetermined position on said semiconductor silicon substrate;
(9) a gate electrode having a P-type polysilicon layer provided in contact with the gate insulating film and a conducting layer provided in contact with the P-type polysilicon layer; and
(10) a pair of source/drain regions including P-type diffusion layers provided at both sides of the gate electrode on a surface region of said semiconductor silicon substrate, the N-type polysilicon layer in said cell transistor containing an N-type impurity at an approximately constant concentration.

2. The semiconductor device according to claim 1, wherein the gate electrode included in the cell transistor having the recess channel structure comprises: the N-type polysilicon layer provided in contact with the gate insulating film; and the conducting layer provided in contact with the N-type polysilicon layer inside the recess and over the recess.

3. The semiconductor device according to claim 2, wherein a concentration of the N-type impurity contained in the N-type polysilicon layer in the cell transistor having the recess channel structure ranges from $1.0 \times 10^{20}$ to $1.0 \times 10^{21}$/cm$^3$ 4. The semiconductor device according to claim 1, wherein the gate electrode included in the cell transistor having the recess channel structure comprises: the N-type polysilicon layer provided in contact with the gate insulating film; a second polysilicon layer provided inside the N-type polysilicon layer and having an impurity concentration of less than $1.0 \times 10^{20}$/cm$^3$; and the conducting layer provided in contact with the N-type polysilicon layer.

5. The semiconductor device according to claim 4, wherein a concentration of the N-type impurity contained in the N-type polysilicon layer in the cell transistor having the recess channel structure ranges from $1.0 \times 10^{20}$ to $1.0 \times 10^{21}$/cm$^3$.

6. The semiconductor device according to claim 1, wherein the gate electrode included in the cell transistor having the recess channel structure comprises: the N-type polysilicon layer provided in contact with the gate insulating film and all over the inside of the recess; and the conducting layer provided in contact with the N-type polysilicon layer.

7. The semiconductor device according to claim 6, wherein a concentration of the N-type impurity contained in the N-type polysilicon layer in the cell transistor having the recess channel structure ranges from $1.0 \times 10^{20}$ to $1.0 \times 10^{21}$/cm$^3$.

8. The semiconductor device according to claim 1, wherein a concentration of the N-type impurity contained in the N-type polysilicon layer in the cell transistor having the recess channel structure ranges from $1.0 \times 10^{20}$ to $1.0 \times 10^{21}$/cm$^3$.

9. A semiconductor device having a memory that includes a cell transistor, a first peripheral transistor and a second peripheral transistor; comprising:
a semiconductor substrate; and
a device separation portion selectively formed in the semiconductor layer to define first, second and third regions;
said cell transistor being formed in the first region and comprising an N-channel MOSFET that includes;
a recess selectively formed in the first region to define first surface portion and a second surface portion apart from each other,
a pair of source/drain regions formed respectively in the first and second surface portions of the first region,
a gate insulating film formed on the recess, and
a gate electrode having an N-type polysilicon layer formed on the gate insulating film,
said first peripheral transistor being formed in the second region and comprising an N-channel MOSFET that includes as a surface channel type a gate electrode having an N-type polysilicon layer, and
said second peripheral transistor being formed in the third region and comprising a P-channel MOSFET that includes as a surface channel type a gate electrode having a P-type polysilicon layer.

10. The device as claimed in claim 9, wherein the gate electrode of the cell transistor further has a first conducting layer formed in contact with the N-type polysilicon layer to fill the recess, the gate electrode of the first peripheral transistor further having a second conducting layer formed in contact with the N-type polysilicon layer, and the gate electrode of the second peripheral transistor further has a third conducting layer formed in contact with the P-type polysilicon layer.

11. The device as claimed in claim 9, wherein the N-type polysilicon layer is a first N-type polysilicon layer and the gate electrode of the cell transistor further has a second N-type polysilicon layer in contact with the first N-type polysilicon layer to fill the recess and a first conducting layer formed in contact with the first and second N-type polysilicon layers, the gate electrode of the first peripheral transistor further having a second conducting layer formed in contact with the N-type polysilicon layer, and the gate electrode of the second peripheral transistor further having a third conducting layer formed in contact with the P-type polysilicon layer.

12. The device as claimed in claim 11, wherein the memory is a Dynamic Random Access Memory.

13. The device as claimed in claim 11, wherein the N-type polysilicon layer in said cell transistor containing an N-type impurity at an approximately constant concentration.

14. The device as claimed in claim 9, wherein the memory is a Dynamic Random Access Memory.

15. The device as claimed in claim 9, wherein the N-type polysilicon layer in said cell transistor containing an N-type impurity at an approximately constant concentration.

* * * * *